(12) United States Patent
Roscoe et al.

(10) Patent No.: US 6,498,731 B1
(45) Date of Patent: Dec. 24, 2002

(54) SYSTEM FOR PROTECTING ELECTRONIC COMPONENTS

(75) Inventors: Brett D. Roscoe, Tomball; George D. Megason; Christian H. Post, both of Spring, all of TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/691,507

(22) Filed: Oct. 18, 2000

(51) Int. Cl.[7] .................................................. H05K 7/14
(52) U.S. Cl. ........................ 361/796; 361/801; 361/807; 361/741; 361/747; 361/756; 361/759; 439/541.5; 439/637; 439/61
(58) Field of Search ................................ 361/796, 800, 361/802, 829, 715, 724, 725, 752, 728–730, 732, 741, 747, 756, 759, 797, 801, 807; 439/571, 572, 892, 541.5, 540.1, 637, 61

(56) References Cited

U.S. PATENT DOCUMENTS

| | | | | |
|---|---|---|---|---|
| 4,602,351 A | * | 7/1986 | Shimamura et al. | .......... 365/52 |
| 6,052,278 A | * | 4/2000 | Tanzer et al. | ................ 361/685 |
| 6,241,545 B1 | * | 6/2001 | Bricaud et al. | ............. 439/326 |
| 6,272,017 B1 | * | 8/2001 | Klatt et al. | .................. 361/737 |

* cited by examiner

Primary Examiner—David S. Martin
Assistant Examiner—Hung Bui
(74) Attorney, Agent, or Firm—Fletcher, Yoder & Van Someren

(57) ABSTRACT

A protective assembly for electronic components. The protective assembly has a base and a first printed circuit board secured to the base. An electronic component is disposed on the printed circuit board and protected by a rigid member that is also secured to the base. The protective assembly is designed to be mechanically and electrically coupleable to a computer-based system.

13 Claims, 5 Drawing Sheets

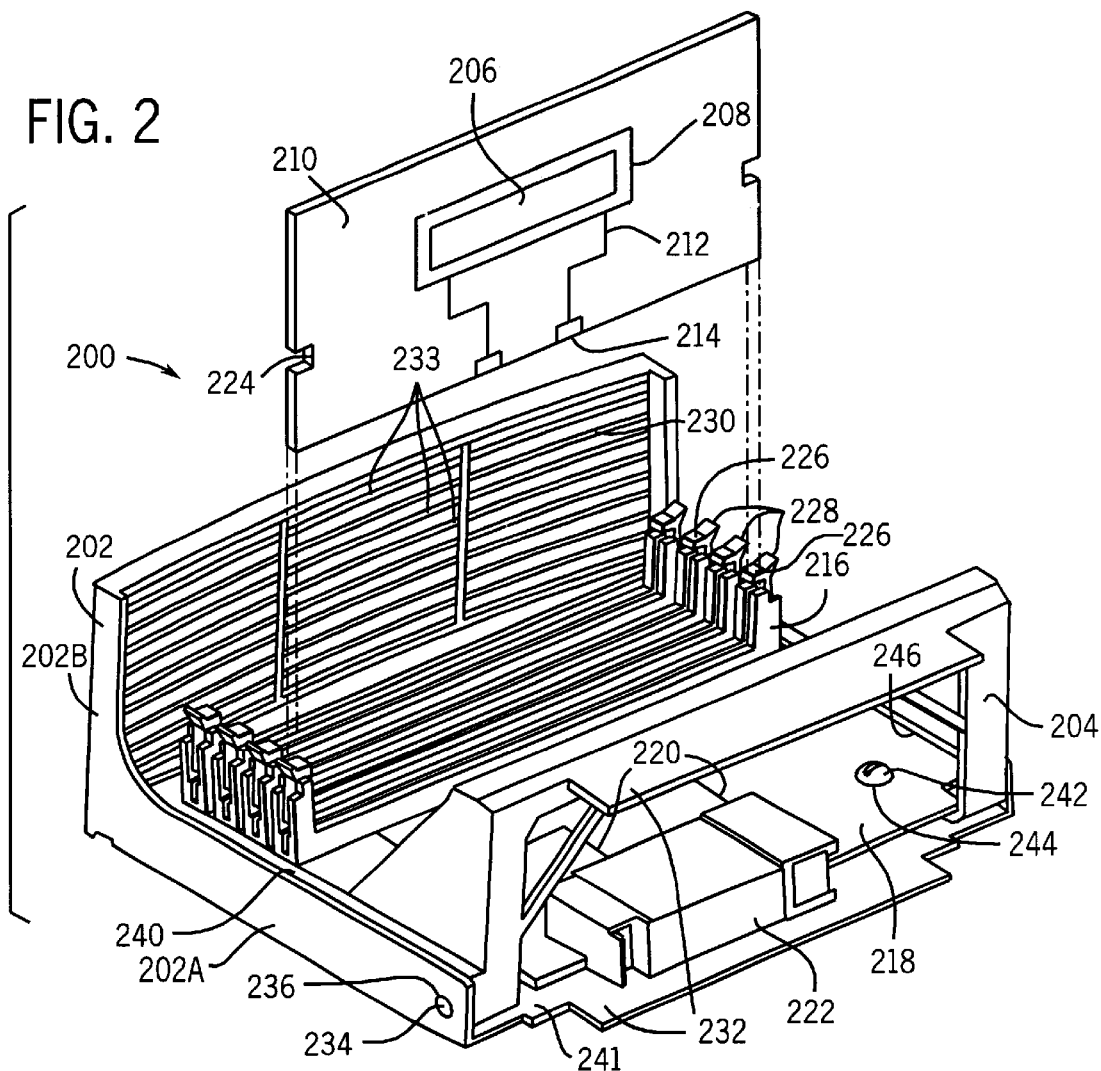

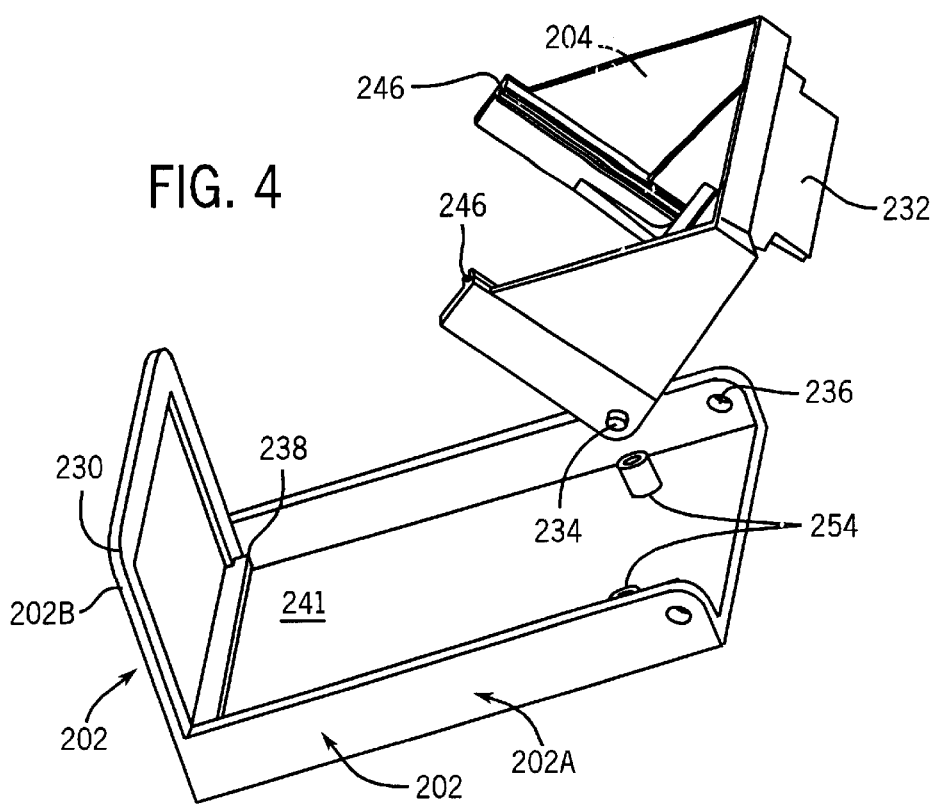
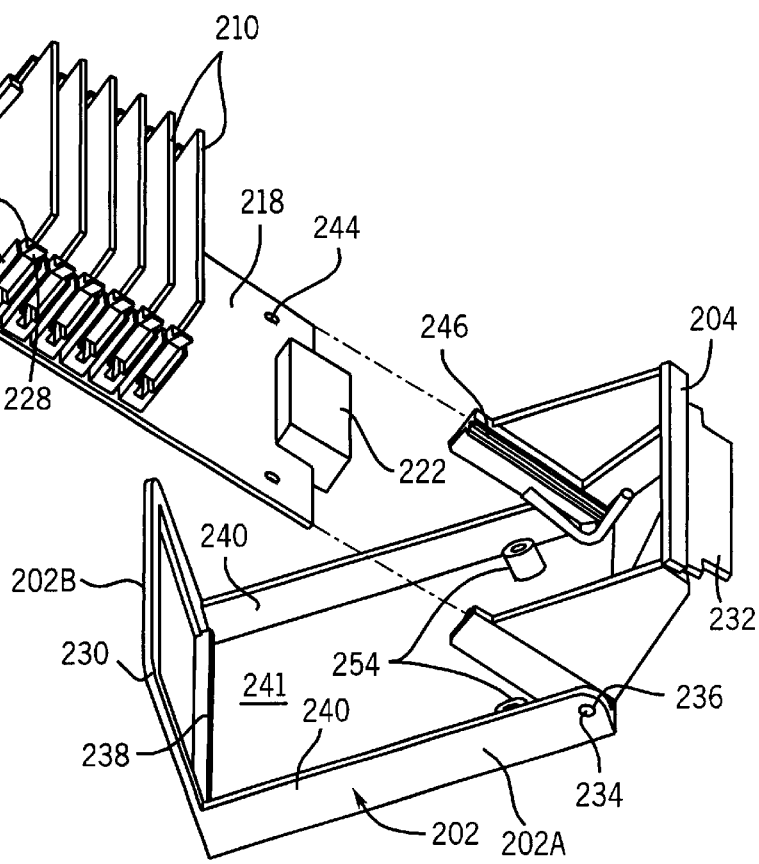

SYSTEM FOR PROTECTING ELECTRONIC COMPONENTS

FIELD OF THE INVENTION

The present invention relates generally to a system for protecting electronic components, and particularly to a system for protecting electronic components disposed on printed circuit boards.

BACKGROUND OF THE INVENTION

Typically, electronic components are installed on printed circuit boards for use in a variety of electrical devices. Electronic components often are built with metal conductive leads to electrically couple the component to the printed circuit board. Typically, the electronic component is placed on a surface of the printed circuit board and the metal leads are soldered to thin layers of copper, called traces, on the printed circuit board. The traces form conductive paths that allow electricity to flow through the printed circuit board.

Soldering serves two purposes. First, soldering helps physically secure the electronic component to the printed circuit board, and second, soldering ensures a good electrical connection between the electronic component and the traces. As an alternative to soldering, electronic components, such as computer chips and memory modules, are inserted into sockets predisposed on the printed circuit board. When the electronic component is inserted into the socket, the leads of the component are electrically coupled by the socket to the traces in the printed circuit board. Typically, a printed circuit board also contains an electrical connector to electrically couple the printed circuit board to another electrical device.

The nature of the electrical components/printed circuit board connections makes the assembled printed circuit boards especially susceptible to damage from mishandling. Dropping a printed circuit board to the floor can effectively ruin the board and any components mounted to it. Damage can occur not only to the electronic components but also to the solder bonds between electronic components and the printed circuit board. Furthermore, computer chips and memory modules can be dislodged from their sockets. Such damaged or dislodged electronic components can be extremely difficult to spot visually. Thus, if a board is dropped during assembly the damage may go undetected until operation of the device is attempted.

Mishandling also can occur when replacing or upgrading electronic components. For example, memory modules are one of the more commonly upgraded features of a computer. Purchasing additional memory modules in order to increase a computer systems memory is fairly common. Furthermore, most computer manufacturers build an upgrade capability into their systems. For example, computer manufacturers routinely install extra sockets on the printed circuit boards so that additional memory elements can be added at a later date. Alternatively, extra slots are reserved in an electrical device so that additional printed circuit boards containing memory modules can be added. Typically, however, in order to upgrade a computer's memory, or repair a damaged memory module an operator must access the interior of the computer, thus exposing the operator to a potential electric shock.

Therefore, it would be advantageous to have a system that could allow electronic components to be removed from an electrical device while protecting electrical components from mishandling and minimizing the potential for electric shock.

SUMMARY OF THE INVENTION

A protective assembly for an electronic component is featured. An electronic component is disposed on a printed circuit board. The protective assembly has a base and a first rigid member secured to the base. The printed circuit board also is secured to the base. The base and the first rigid member are configured to prevent both the electronic component and the printed circuit board from contacting a planar surface, such as a table top or the floor, when the assembly is disposed against the planar surface.

According to another aspect of the present invention, a system is featured for protecting an electrical component within an electronic device. The system includes a first printed circuit board and an electronic component coupled to the first printed circuit board. A first electrical connector is electrically coupled to the first printed circuit board. The first printed circuit board is secured to a protective assembly which is mechanically securable to an enclosure having a second electrical connector. The first electrical connector is electrically coupleable to the second electrical connector.

According to another aspect of the present invention, a microprocessor-based device having a removable protective assembly is featured. The device includes an enclosure having a motherboard and a microprocessor. The motherboard includes a first electrical connector, and the microprocessor is electrically coupled to the motherboard. The system also includes a protective assembly. The protective assembly has a daughterboard and an electronic component disposed on the daughterboard. The daughterboard is secured to the protective assembly and has a second electrical connector electrically coupled to the electronic component. The protective assembly is configured such that the electrical component does not contact a planar surface when the protective assembly is disposed on the planar surface in any orientation.

According to another aspect of the present invention, a method for assembling an electronic device is featured. The method includes locating an electronic component on a printed circuit board and placing the printed circuit board within a protective assembly. The protective assembly prevents inadvertent contact with or jarring of the electronic component.

BRIEF DESCRIPTION OF THE DRAWINGS

The invention will hereafter be described with reference to the accompanying drawings, wherein like reference numerals denote like elements, and:

FIG. 2, is a perspective view of a protective assembly, according to a preferred embodiment of the present invention;

FIG. 3 is a front perspective view of an electronic device and protective assembly, according to a preferred embodiment of the present invention;

FIG. 4 is an exploded view illustrating the assembly of a rollbar to a protective assembly base, according to a preferred embodiment of the present invention;

FIG. 5 is an exploded view similar to that of FIG. 4 and illustrating the insertion of printed circuit board into the protective assembly;

DETAILED DESCRIPTION OF THE PREFERRED EMBODIMENTS

Figure 1:
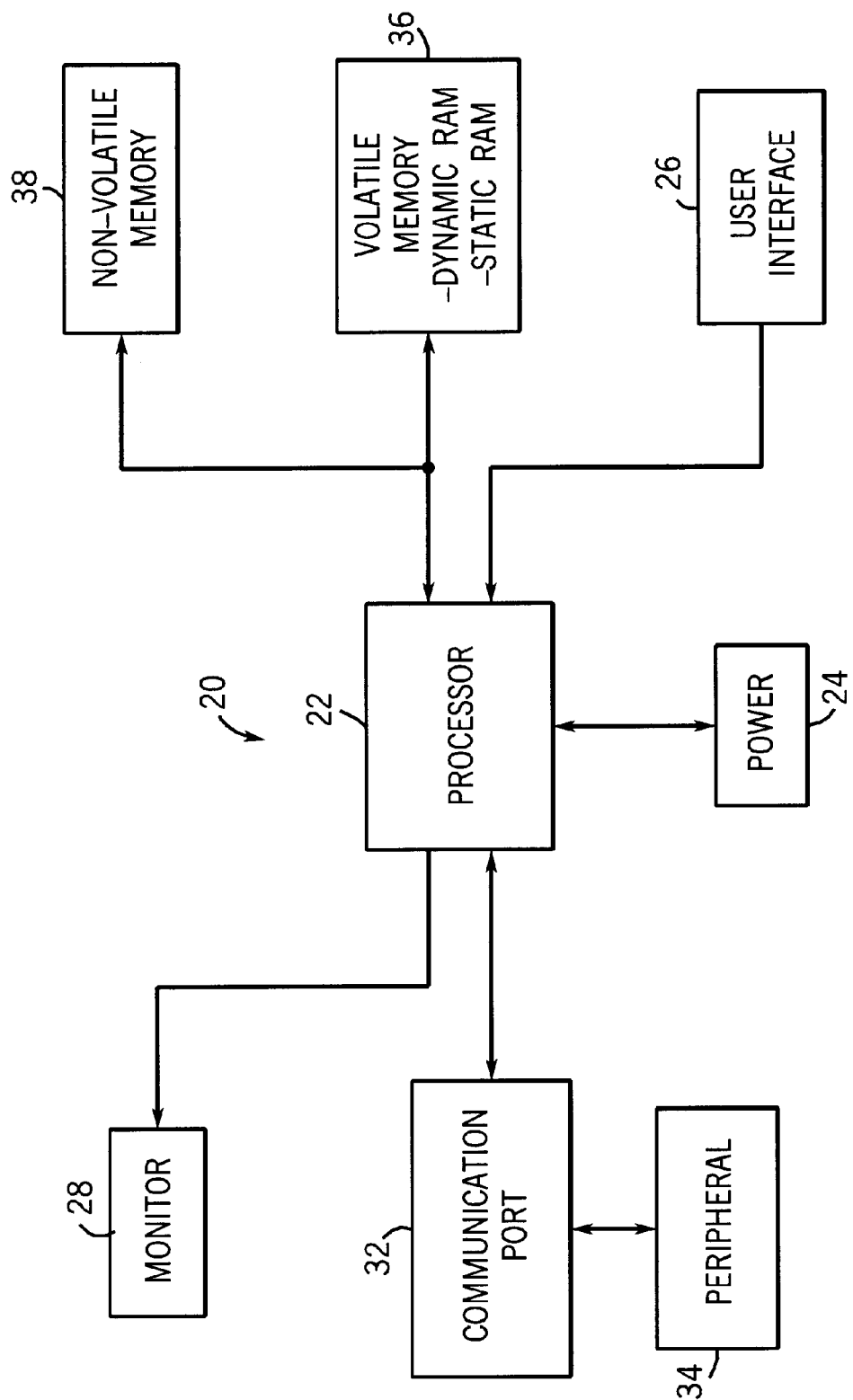
FIG. 1 is a block diagram of an electronic device.
Figure 6:
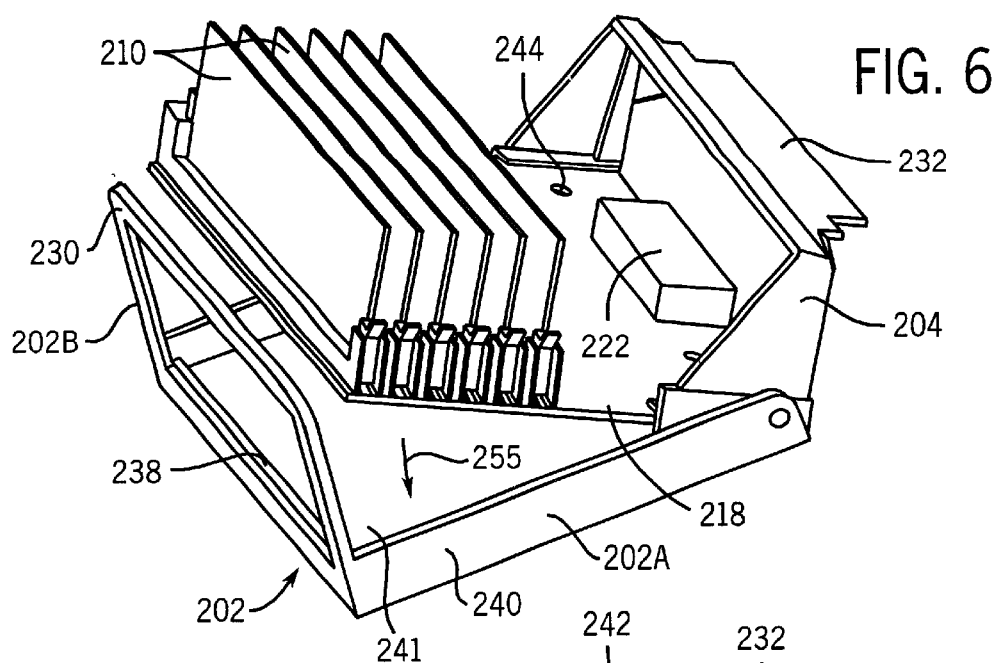
FIG. 6 is a perspective view of the protective assembly and printed circuit board illustrated in FIG. 5.

Referring generally to FIG. 1, a block diagram is illustrated depicting an exemplary electronic device, generally designated by the reference numeral 20. Electronic device 20 may be any of a variety of different types, such as a server, a personal organizer, a notebook computer, a personal computer, a workstation, an Internet server, a minicomputer, etc. In a typical electronic device, a processor controls many of the functions of the device. In the illustrated embodiment, processor 22 controls the functions of electronic device 20. An exemplary electronic device 20 also is illustrated in FIG. 3 and discussed below.

Electronic device 20 typically includes a power supply 24. If device 20 is portable, power supply 24 includes permanent batteries, replaceable batteries, and/or rechargeable batteries. Power supply 24 may also include an A/C adapter, so that the device. may be plugged into a wall outlet, for instance. In fact, power supply 24 may also include a D/C adapter, so that device 20 may be plugged into the D/C voltage of a vehicle.

Various other devices may be coupled to processor 22, depending upon the functions that device 20 performs. For example, a user interface 26 may be coupled to processor 22. Examples of user interfaces 26 include buttons, switches, a keyboard, a light pen, a mouse, and/or a voice recognition system. A display 28 may also be coupled to processor 22. Examples of displays 28 include: a television screen, a computer monitor, LEDs, or even an audio display. A communications port 32 may also be coupled to processor 22. Communications port 32 may be adapted to be coupled to a peripheral device 34, such as a printer, a computer or an external modem.

Typically, processor 22 utilizes programming to control the function of device 20. Memory is coupled to processor 22 to store and facilitate execution of the programming. For example, processor 22 may be coupled to a volatile memory 36 and a non-volatile memory 38. Non-volatile memory 38 may include a read only memory (ROM), such as an EPROM, to be used in conjunction with volatile memory 36. The size of the ROM is typically selected to be just large enough to store any necessary operating system, application programs, and fixed data. Volatile memory 36, on the other hand, is typically quite large so that it can store dynamically loaded applications. Additionally, non-volatile memory 38 may include a high capacity memory such as a disk or tape drive memory.

A variety of memory modules, such as DIMMs, DRAMs, SDRAMs, SRAMs, etc. can be utilized for a given device or application. The present protective assembly, discussed below, is particularly amenable to protecting electric components such as memory modules that are utilized in, for example, a server.

Referring generally to FIG. 2, a protective assembly or cartridge 200 is shown according to an exemplary embodiment of the present invention. Protective assembly 200 includes a base 202 and a rollbar 204. Base 202 and rollbar 204 protect electronic components disposed within protective assembly 200 from damage due to mishandling. Base 202 includes a primary base region 202A and a secondary base region 202B that extends generally transversely, e.g. perpendicularly, from primary base region 202A. Rollbar 204 also extends generally transversely from primary base region 202A in the same general direction as secondary base region 202B. Effectively, secondary base region 202B acts as a second rollbar spaced from rollbar 204.

In the illustrated embodiment, an electronic component 206, e.g. a memory module, is mounted in a socket 208. Socket 208 is, in turn, mounted on printed circuit board 210, hereinafter referred to as a "daughterboard". Conductive traces 212 on daughterboard 210 electrically couple memory module 206 to conductive strips 214 along an edge of daughterboard 210. Daughterboard 210 is installable into electrical connector 216. Electrical connector 216 is mounted on a second printed circuit board 218, hereinafter referred to as a "motherboard."

Motherboard 218 serves to secure daughterboard 210 into protective assembly 200 and to electrically couple daughterboard 210 to device 20. Edge connectors 216 contain conductive elements that contact conductive strips 214. Motherboard 218 also has conductive traces 220 that electrically couple electrical connector 216 to a multi-pin connector 222. Multi-pin connector 222 is, in turn, electrically coupleable to a respective multi-pin connector disposed within the electronic device. Thus, when the multi-pin connectors are joined, a conductive path from memory module 206 through protective assembly 200 to electronic device 20 is completed.

In the illustrated embodiment, edge connector 216 also mechanically secures daughterboard 210 to motherboard 218. Daughterboard 210 may be manufactured with small notches 224 on the sides. Clips 226 of electrical connector 216 fit into the notches, holding daughterboard 210 securely within electrical connector 216. Each clip 226 has a thumb release 228 that, when operated, pulls the clip from the corresponding notch 224, allowing the subject daughterboard to be removed from the electrical connector 216.

In the illustrated embodiment, secondary base region 202B includes a grill 230 disposed at a predetermined distance from rollbar 204 to protect the memory modules 206. Grill 230 and rollbar 204. extend from the base 202 and above or beyond the electrical components 206 located on daughterboard 210. Thus, if protective assembly 200 inadvertently strikes an object, such as the floor or a desktop, either base 202 or rollbar 204 tends to absorb the impact rather than daughterboard 210 or memory module 206. Additionally, base 202 and rollbar 204 are constructed with tabs 232 to protect multi-pin connector 222. Thus, multi-pin connector 222 will not strike the ground first if protective assembly 200 is dropped. It should be noted that grill 230 may be constructed with ventilation holes 233 to allow air to cool memory module 206 or the grill may be removed altogether, depending on the application.

In the exemplary embodiment, rollbar 204 is attached to base 202 with a pin-and-socket system. Rollbar 204 includes a pair of outwardly extending pins 234, while base 202 includes a pair of corresponding sockets or apertures 236. Pins 234 are pivotably disposed in sockets 236, allowing the rollbar 204 to pivot during the assembly process, as illustrated in FIGS. 4–7.

As further illustrated in FIGS. 4–7, motherboard 218 is secured to protective assembly 200 by a lip 238 extending from the base of grill 230. The motherboard 218 is further secured by a pair of base side walls 240 extending generally perpendicular to both motherboard 218 and a support wall 241 of base 202 that connects side walls 240. Motherboard 218 also is secured by one or more fasteners, such as a pair of screws 242 inserted through two corresponding holes 244 in motherboard 218. Lip 238 and screws 242 prevent movement of motherboard 218 in one axial direction, while the side walls 240 of base 202 prevent lateral movement. A pair of board guides 246 in rollbar 204 are sized to slidably receive and further support motherboard 218.

Referring again to FIG. 3, an electronic device 20 is shown, according to a preferred embodiment of the present invention. In the exemplary embodiment shown, the electronic device comprises a server having a chassis 248. Chassis 248 is designed to receive protective assembly 200 and to protect an electronic component, e.g. memory modules. Protective assembly 200 is removable from electronic device chassis 248 and allows electronic components to be easily accessed, without the need for tools and without the need to disassemble chassis 248.

Once removed from the device, new electronic components, such as memory modules, can be added to protective assembly 200 to upgrade or replace the device's electronic components. The exemplary device 20 includes multi-pin connector 252 configured to mate with multi-pin connector 222 of protective assembly 200. Preferably, chassis 248 and protective assembly 200 are configured so that the multi-pin connectors are properly aligned and mated when protective assembly 200 is inserted into chassis 248.

Interaction of the various components of protective assembly 200 can be better understood with reference to FIGS. 4–8. Referring generally to FIG. 4, rollbar 204 initially is pivotably secured to base 202 by, for example, receipt of two pins 234 in corresponding sockets 236. Rollbar 204 is manufactured from a material, such as plastic, that requires a relatively small force to compress the rollbar 204 so that pins 234 can be inserted in the sockets 236. The pin-and-socket arrangement allows the pins 234 to rotate within the sockets 248, thus allowing the rollbar 204 to pivot. Screws 242 are threaded into corresponding sockets 254 disposed on support wall 241 of base 202.

Referring generally to FIG. 5, the rollbar 204 also serves to facilitate the installation of motherboard 218 and a plurality of daughterboards 210 into the protective assembly 200. After connecting rollbar 204 to base 202, rollbar 204 is pivoted clockwise to permit insertion of motherboard 218 into board guides 246. The daughterboards 210 may be inserted prior to insertion of motherboard 218 into guides 246 or at a later stage. After receiving motherboard 218 in board guides 246, rollbar 204 and motherboard 218 are pivoted counterclockwise, along arrow 255 of FIG. 6, to place motherboard 218 against base 202.

Figure 7:
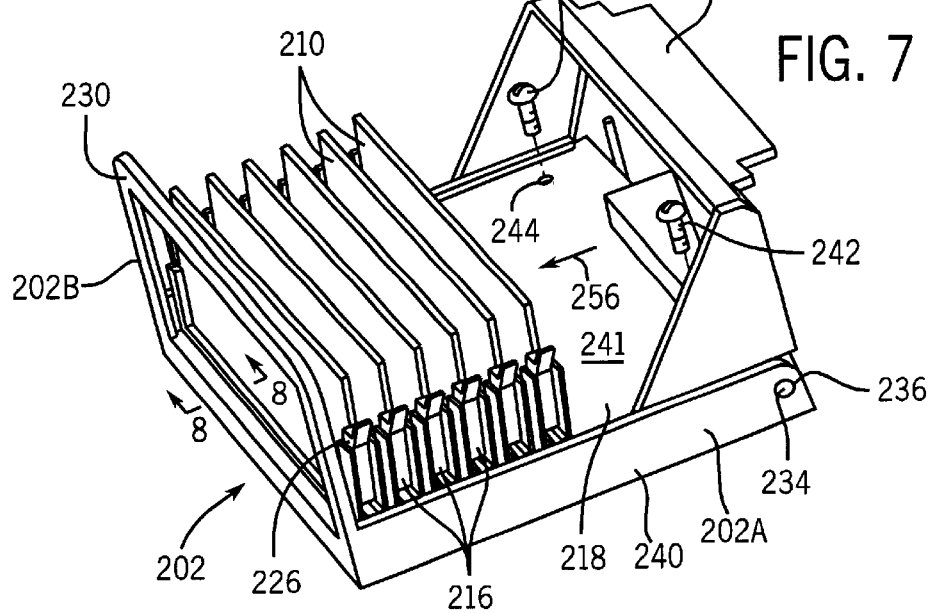
FIG. 7 perspective view of the protective assembly and printed circuit board illustrated in FIG. 5.
Figure 8:
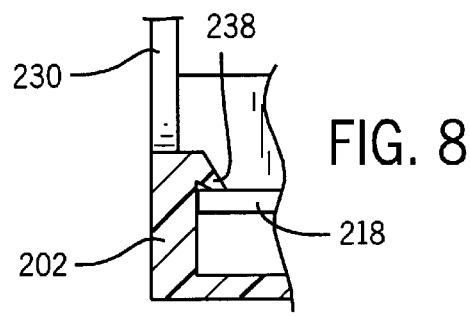
FIG. 8 is a cross-sectional view taken generally along line 8—8 of FIG. 7 illustrating a lip on the base for holding the printed circuit board.

Referring generally to FIG. 7, once motherboard 218 is placed against base 202, motherboard 218 is moved towards secondary base region 202B along arrow 256. Lip 238, as best illustrated in FIG. 8, holds the edge of motherboard 218 adjacent grill 232 against base 202. Two screws 242 threaded into sockets 254 further secure motherboard 218 to base 202. If not added previously, daughtetboards 210 may be disposed within the electrical connectors 216 on motherboard 218 at this time. The protective assembly is now ready for insertion into electronic device 20.

Figure 9:
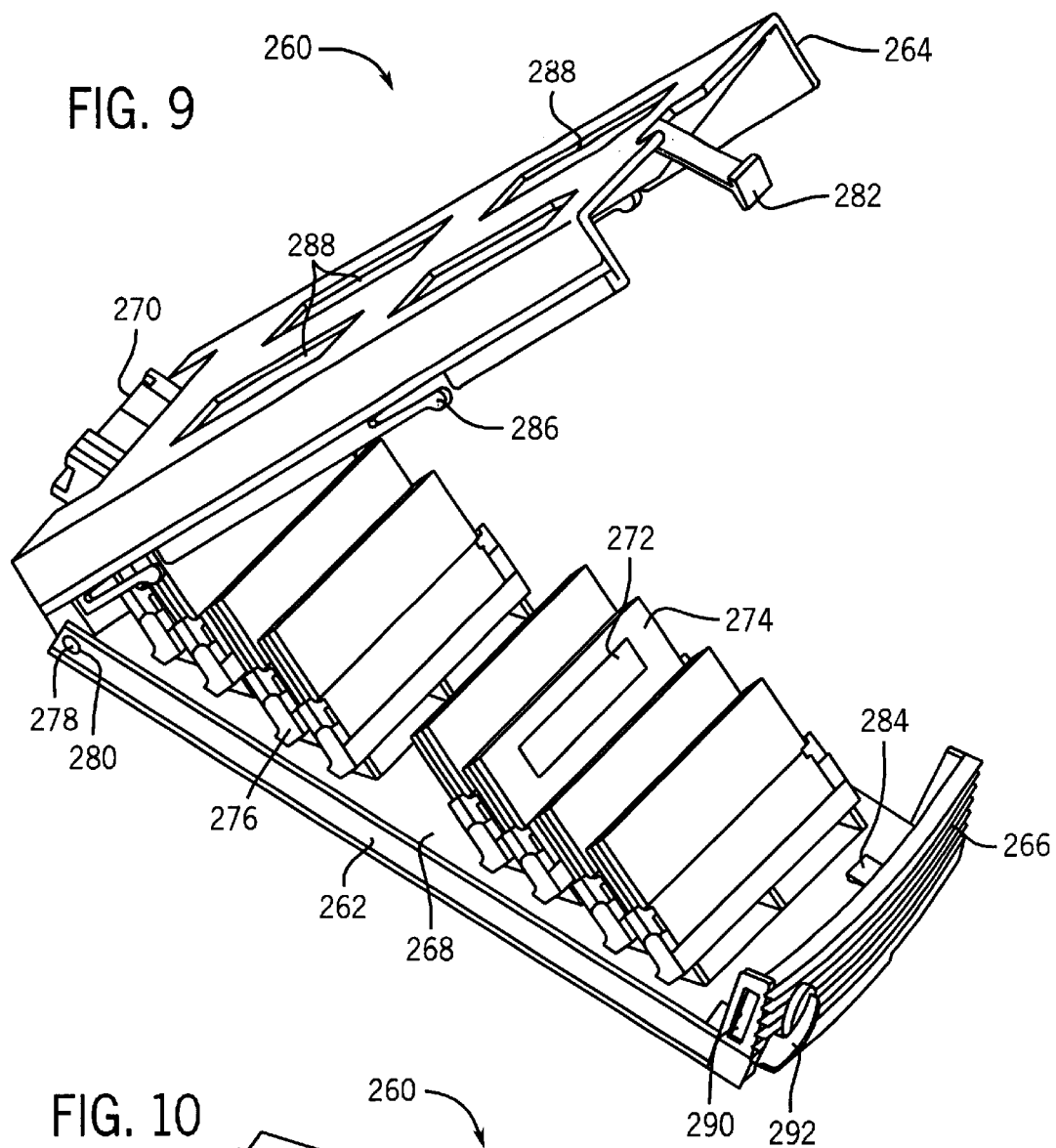
FIG. 9 is a perspective view of an alternative embodiment of a protective assembly with its cover open.

Referring generally to FIG. 9, an alternative embodiment is shown for a protective assembly for electronic components. A protective assembly 260 includes a base 262 and a cover 264. In this embodiment, cover 264 also provides protection to the electronic component from sharp objects and non-planar surfaces, such as the edge of a table.

Base 262 has a front protective wall 266 that may be in the form of a grill. A motherboard 268, including an electrical connector 270, is disposed onto base 262. Electronic components 272, such as memory modules, are disposed onto a daughterboard 274. Daughterboard 274 may be disposed in an angled board holder 276. The angled board holder 276 allows protective assembly 260 to have a lower overall profile by securing daughterboards 274 at an angle, rather than upright.

Figure 10:
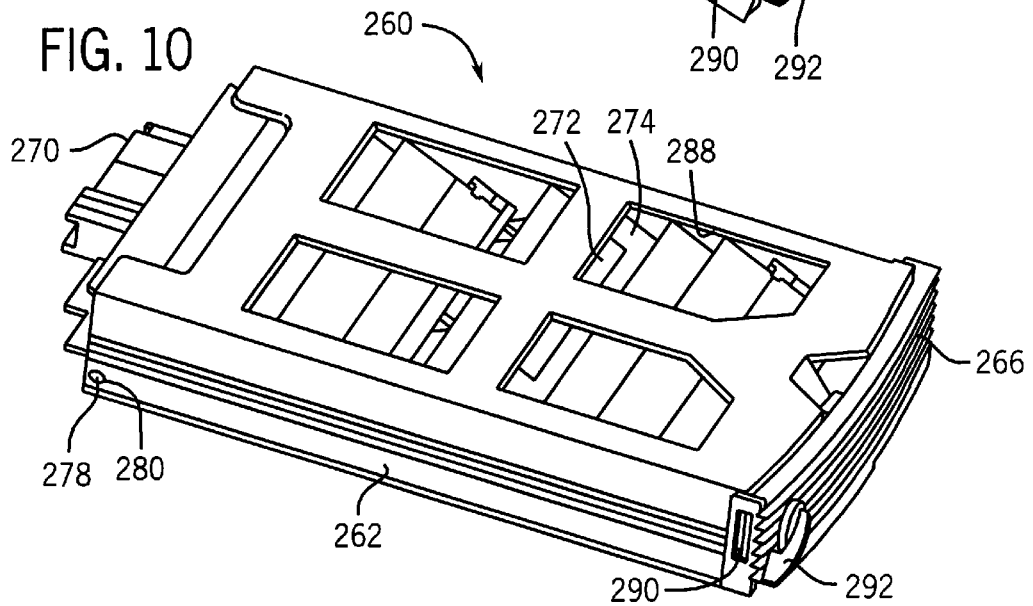
FIG. 10 is a perspective view of the alternative embodiment illustrated in FIG. 9, but with the cover closed.

Cover 264 is secured to base 262 with a pin-and-socket system. In the illustrated embodiment, cover 264 has two pins 278, which fit into two-sockets 280 in base 262. Pins 278 are free to rotate within the sockets 280, allowing cover 264 to pivot. Cover 264 also has a latch 282 which can be used to secure the cover to a catch 284 on grill 266. A spring element 286 on cover 264 is compressed against base 262 when cover 264 is latched, as shown in FIG. 10. When latch 282 is removed from catch 284 the energy stored in spring element 286 acts to spring open the cover 264. Ventilation holes 288 in cover 264 allow air to flow over and cool electronic components 272.

As illustrated, the protective assembly includes a latch mechanism to secure protective assembly 260 within an electronic device. The latch mechanism includes a latch 290 and an operator 292. As operator 292 is turned it causes latch 290 to rotate, engaging the latch 290 against a respective catch in the electronic device. Operator 292 is rotated to disengage latch 290 in order to remove protective assembly 260 from the device. When cover 264 is closed, the protective cartridge is ready for installation into an electronic device.

It will be understood that the foregoing description is of preferred exemplary embodiments of this invention, and that the invention is not limited to the specific forms shown. For example, a variety of rollbar configurations and protective cartridge configurations can be utilized depending on the particular application. These and other modifications may be made in the design and arrangement of the elements without departing from the scope of the invention as expressed in the appended claims.

What is claimed is:

1. A system for protecting an electrical component within an electrical device, comprising:
    a first printed circuit board, wherein at least one memory module is coupled to the first printed circuit board, wherein each memory module is mounted on a second printed circuit board;
    a first electrical connector electrically coupled to the first printed circuit board;
    a protective cartridge, the cartridge being designed to receive the first printed circuit board and to prevent contact between a planar surface and the at least one memory module; and
    an enclosure, having a second electrical connector, wherein the protective cartridge is mechanically securable to the enclosure and the first electrical connector is electrically coupleable to the second electrical connector.

2. The assembly as recited in claim 1, wherein the protective cartridge is mechanically coupleable to a server.

3. The assembly as recited in claim 1, wherein the protective cartridge extends over a portion of the first electrical plug connector.

4. The system as recited in claim 1, wherein the protective cartridge further comprises:
    a base; and
    a rollbar secured to the base.

5. The system as recited in claim 4, further comprising a second rollbar that extends from the base to a height above the at least one memory module.

6. The system as recited in claim 5, wherein the second rollbar includes a grill having a passageway that allows air to flow through the grill to cool the at least one memory module.

7. The system as recited in claim 4, wherein the base has a retention lip configured to extend over the first printed circuit board.

8. The assembly as recited in claim 4, wherein the rollbar is pivotally disposed on the base.

9. The assembly as recited in claim 8, wherein the rollbar includes printed circuit board guides.

10. The system as recited in claim 1, wherein the second printed circuit board is coupled to the first printed circuit board by a third electrical connector.

11. The system as recited in claim 10, wherein the third electrical connector is flexibly coupled to the first printed circuit board.

12. The system as recited in claim 11, wherein the protective cartridge comprises:

a base; and a cover pivotably secured to the base.

13. The assembly as recited in claim 12, wherein the cover includes a spring element, the spring element producing an opening force when the cover is closed.

* * * * *